United States Patent [19]

Weisbrod

[11] 4,080,571
[45] Mar. 21, 1978

[54] APPARATUS FOR MEASURING THE CURRENT-VOLTAGE CHARACTERISTICS OF A TRAPATT DIODE

[75] Inventor: Sherman Weisbrod, Hamilton Square, N.J.

[73] Assignee: RCA Corporation, New York, N.Y.

[21] Appl. No.: 692,548

[22] Filed: Jun. 3, 1976

[51] Int. Cl.² .......................................... G01R 31/22
[52] U.S. Cl. ............................................... 324/158 D
[58] Field of Search ........... 324/158 D, 158 T, 158 R, 324/73 R

[56] References Cited

U.S. PATENT DOCUMENTS

| | | | |
|---|---|---|---|
| 2,894,313 | 7/1959 | Stineman, Jr. et al. | 324/158 D |
| 3,296,523 | 1/1967 | Haas | 324/158 D |
| 3,736,506 | 5/1973 | Griffin | 324/158 D |

Primary Examiner—Rudolph V. Rolinec
Assistant Examiner—Ernest F. Karlsen
Attorney, Agent, or Firm—H. Christoffersen; Robert M. Rodrick; Joseph D. Lazar

[57] ABSTRACT

An apparatus for measuring the current-voltage characteristics of a TRAPATT diode to determine its operational performance prior to mounting in its intended circuit. The apparatus comprises a pulse generator for generating a pulsed signal which is modulated by a modulator such that the current of the pulsed signal as applied to the diode periodically increases and decreases. The modulating signal is generated by a full wave bridge rectifier. The modulated signal sweeps the current applied to the diode through the characteristic curve of the diode triggering the diode into the TRAPATT mode of operation. An indicator such as an oscilloscope coupled to the diode displays the characteristic curve including the negative resistance region of the diode occurring during TRAPATT operation.

9 Claims, 6 Drawing Figures

APPARATUS FOR MEASURING THE CURRENT-VOLTAGE CHARACTERISTICS OF A TRAPATT DIODE

BACKGROUND OF THE INVENTION

1. Field of the Invention

This invention relates to a test apparatus and more particularly to an apparatus for measuring the current-voltage characteristics of a TRAPATT diode.

2. Description of the Prior Art

It is often desirable to evaluate the performance of devices such as TRAPATT diodes before they are mounted in a circuit to eliminate the time and cost of packaging and tuning such devices of poor quality. Furthermore, a TRAPATT diode, because of its relatively high operating power, will sometimes burn out when the diode itself or other elements in an oscillator or amplifier circuit malfunction. It is difficult, if not impossible, to select in advance a replacement diode without pretesting the diode in its actual circuit environment.

According to present understanding of principles of operation, a TRAPATT diode has a threshold voltage level which when met or exceeded triggers the diode into the so-called TRAPATT mode of operation. Typically, in the case of an oscillator circuit, the diode is reverse biased by a pulsed or D.C. voltage equal to or greater than the threshold value required for TRAPATT operation. For an amplifier, the diode is usually reverse biased by a pulsed or D.C. voltage somewhat below the threshold value. The diode will be triggered into the TRAPATT mode when the reverse bias voltage combines with an applied RF signal of sufficient amplitude.

When the threshold conditions for the TRAPATT mode are met, the diode operation voltage drops sharply and a large current is drawn from the bias voltage power supply giving rise to the so-called "transit-time" oscillation at a certain frequency. These "transit-time" oscillations of the TRAPATT mode create a negative resistance region in the diode's current-voltage characteristic curve. It has been found that the magnitude of the negative resistance region is related to the high power performance of TRAPATT diodes. Thus by identifying the negative resistance region of such diodes it is possible to predict the diodes' performance in a circuit.

None of the known prior art diode testing arrangements provides the conditions for testing TRAPATT diode operation outside of its intended circuit environment, particularly the measurement of the negative resistance region of the TRAPATT mode. Prior art arrangements for testing TRAPATT diode operation may be termed in situ testing. The shortcoming of such a test procedure is mentioned above: the failure of a diode requires reconstruction of the circuit. Testing circuits conventionally used for "low current" diodes will not properly test the performance of a TRAPATT diode. One of the problems encountered is that such conventional test circuits often oscillate during the TRAPATT mode of operation. As a result of this problem, diodes are often packaged in their intended circuits in order to evaluate them properly as an in situ test.

SUMMARY OF THE INVENTION

According to the present invention, an apparatus is provided for measuring the current-voltage characteristics of a specimen diode having a voltage response which is a single-valued function of current. The apparatus comprises means for generating a pulsed signal at a given pulse repetition rate. Means for generating a modulating signal for modulating the pulsed signal is included. The modulating signal has a periodic time-varying amplitude and a periodic rate that is significantly less than the repetition rate of the pulsed signal. The pulsed signal is modulated by means responsive to said modulating signal to generate a modulated pulsed signal which increases and decreases periodically with respect to time. The current of the periodically modulated signal is swept through a predetermined range of current values during each modulation period. The apparatus includes means for coupling the modulated pulsed signal to the specimen diode, the specimen diode producing a single-valued voltage as a function of the current of the modulated pulsed signal. Also included is means coupled to the specimen for indicating the output current-voltage characteristics of the specimen diode. In a preferred embodiment of the invention, the apparatus is used to measure the current-voltage characteristics of a TRAPATT diode which exhibits a negative resistance during operation in the TRAPATT mode. The coupling means of the apparatus is arranged to have a characteristic impedance greater than the magnitude of the diode negative resistance to prevent the apparatus from oscillating during the TRAPATT mode of operation.

DETAILED DESCRIPTION OF THE PREFERRED EMBODIMENT

Figure 1:
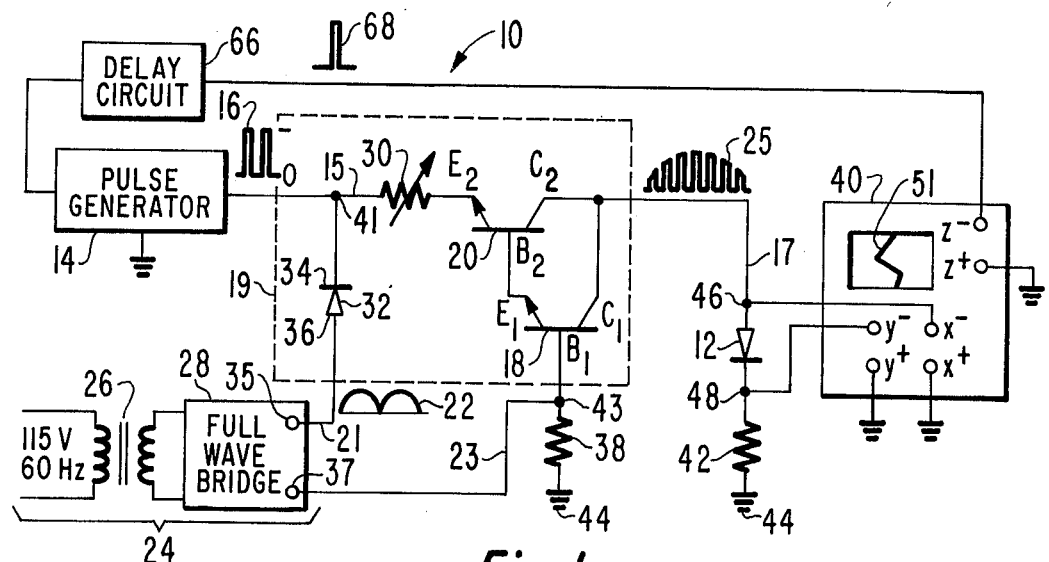
FIG. 1 is a schematic circuit representation of a preferred embodiment of the invention.

Referring to the drawing, there is shown in FIG. 1 a schematic circuit 10 of an apparatus for measuring the current-voltage characteristics of a specimen diode 12, namely, a TRAPATT diode. TRAPATT diode 12 exhibits a negative resistance region, as described above, in its current-voltage characteristic curve when reverse biased into breakdown at its threshold value. It has been found that this negative resistance is current controlled. Therefore, according to the invention, the current, and not the voltage which is a single-valued function of current, is swept through the characteristic curve of diode 12 under test as will be explained.

A pulse generator 14 provides a pulsed signal 16 having a given pulse repetition rate. Each pulse of the pulsed signal 16 is preferably of rectangular waveform. The pulsed type signal is utilized to limit the heating effects on diode 12 due to the high power developed by diode 12 during operation. It is preferable that the pulse duty cycle be less than 0.1 percent to minimize these heating effects. Pulsed signal 16 is modulated in modulating circuit 19. Modulating circuit 19 includes a pair of transistors 18 and 20 arranged in the well-known Darlington connection. The Darlington pair of transistors 18 and 20 are utilized to provide, in combination, a high gain, high current device. It will be understood, however, that a single transistor or a larger plurality of transistors exhibiting similar characteristics may also be used to serve as the high gain, high current device. Transistor 18 has a base, $B_1$, emitter, $E_1$, and collector, $C_1$. Transistor 20 has a base, $B_2$, connected to emitter $E_1$, an emitter $E_2$, and a collector, $C_2$. Collector $C_2$ is connected in common with $C_1$ at circuit line 17, circuit line 17 being connected to one terminal of TRAPATT diode 12 to be tested. In the preferred embodiment, emitter $E_2$ is connected to a variable resistor 30. Variable resistor 30 is connected to circuit line 15, circuit line 15 being connected to pulse generator 14 to receive the pulsed signal 16. A diode 32 is included in modulating circuit 19, the cathode electrode 34 of diode 32 being connected to circuit line 15 at junction 41.

It will be appreciated that any suitable transistor configuration may be provided in the modulating circuit 19.

A modulating signal 22, for modulating signal 16 is applied to modulating circuit 19 preferably by a conventional full wave bridge rectifier 24. Modulating signal 22 has a periodic time-varying amplitude and a periodic rate that is significantly less than the repetition rate of the pulsed signal 16. Bridge rectifier 24 comprises a transformer 26 and a full wave bridge 28 to convert an alternating current from a power supply (not shown) to a unidirectional, pulsating current having a nonzero average value of well known form. One terminal 35 of bridge 28 is connected to anode electrode 36 of diode 32 as by circuit line 21 and the other terminal 37 of bridge 28 is connected to base $B_1$ of transistor 18 as by circuit line 23. Although modulating signal 22 is preferably a full-wave rectified sine wave signal, any generator producing a periodically increasing and decreasing waveform, such as a triangular wave, may also be used to provide modulating signal 22.

A suitable display device or indicator of the characteristic curve of the diode 12 under test such as oscilloscope 40 is suitably coupled to the diode 12 as shown.

In operation of the test apparatus, modulating signal 22 is applied to modulating circuit 19 for modulating signal 16. The modulating signal 25 (FIG. 1) is conducted via line 17 to test diode 12. In order for current to flow through the pair of transistors 18 and 20 to diode 12, the voltage of base $B_1$ must be positive with respect to emitter $E_2$ in this embodiment. Thus, in this embodiment the signal 16 is arranged to be negative and base $B_1$ is maintained positive by preferably connecting base $B_1$ to ground 44 through a resistor 38 of relatively high ohmic resistance, i.e., in the order of two kilohms. By modulating the emitter $E_2$ to base $B_1$ voltage, i.e., by making the base $B_1$ less positive with respect to emitter $E_2$, the conductive path from the emitter $E_2$ to collector $C_2$ is varied, regulating thereby the current that flows to diode 12.

The emitter $E_2$ to base $B_1$ voltage is modulated by biasing the base $B_1$ of transistor 18 by controlling the conduction of modulating signal 22 through diode 32. As described above, for the pair of transistors (18, 20) to operate, i.e., be in an "ON" condition, the voltage at base $B_1$ with respect to emitter $E_2$ (hereafter termed, $V_{BE}$) must be positive. Upon the application of pulsed signal 16 to modulating circuit 19, a voltage drop $V_D$ is developed across diode 32 and a voltage drop $V_R$ across resistor 30. When the voltage drop across junctions 41 and 43 of FIG. 1, i.e., $V_R$ plus $V_{BE}$, exceeds the voltage drop $V_D$ of diode 32 plus the voltage of bridge 28, diode 32 will conduct. As diode 32 conducts, it biases base $B_1$ of transistor 18 making the voltage of base $B_1$ less positive with respect to emitter $E_2$ and will so operate until the voltage drop $V_{BE}$ is zero, at which time the transistors (18, 20) will be in an "OFF" condition and will thus stop conducting. By appropriate selection of the value of the ohmic resistance of variable resistor 30 and the maximum voltage of the modulating signal 22 from bridge 28, the current of the modulated signal 25 can be limited to reduce thereby the problem of undesired deleterious excessive currents. Also by selecting a pulse generator 14 having a current level which will not burn out diode 12, variable resistor 30 may be eliminated since no means of limiting the current will be required.

Figure 2A:
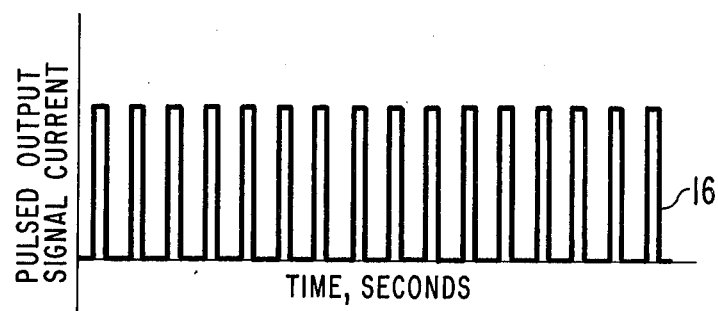
FIGS. 2(a), 2(b) and 2(c) are curves showing various waveforms used in describing the present invention.
Figure 2B:
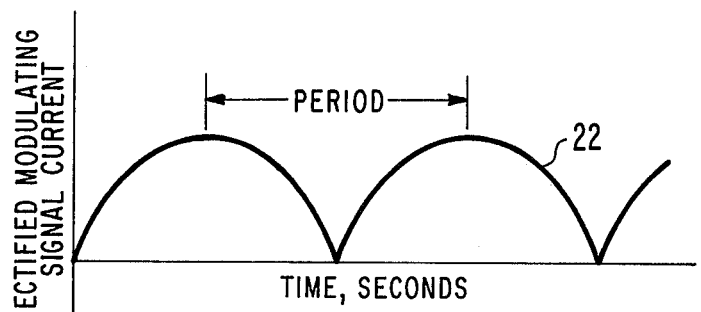
Figure 2C:
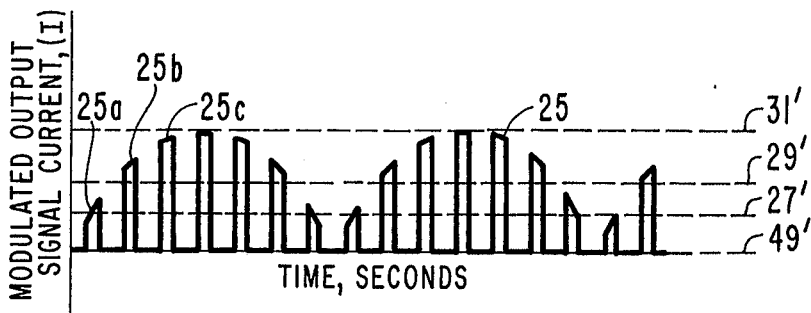

To more fully understand the modulation effect on signal 16, reference is now made to FIGS. 2(a), (b), and (c). In FIG. 2(a), there is shown a waveform of the current of pulsed signal 16 from generator 14. In FIG. 2(b) there is depicted the current waveform of rectified modulating signal 22 as generated by full wave bridge rectifier 24. Modulation of signal 16 by modulating signal 22 by effectively switching diode 32 on and off as described above, produces a modulated signal 25, the current waveform of signal 25 being shown in FIG. 2(c).

Figure 3:
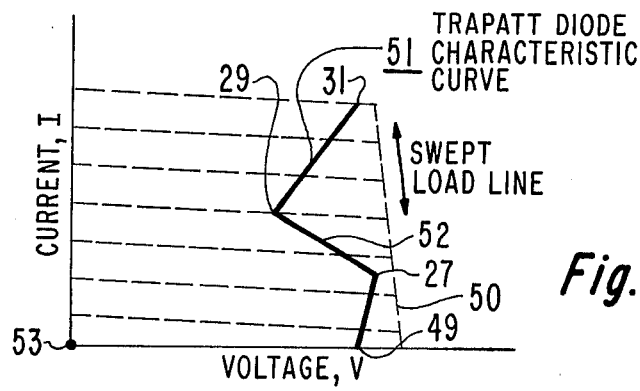
FIG. 3 is a curve showing the current-voltage characteristics of a TRAPATT diode.

Referring back to FIG. 1, the current-voltage characteristic curve 51 of diode 12 is displayed on oscilloscope 40 as shown in FIG. 3. The modulated signal 25 sweeps the load line 50 which traces the current controlled negative resistance region 52 of TRAPATT diode 12. It should be noted that the swept load line 50 is not displayed on oscilloscope 40. By suitably calibrating oscilloscope 40, the current and voltage along characteristic curve 51 can be measured to an accuracy of about 1%. Other indicating means, such as for example, an X-Y recorder may also be used to observe and measure the diode 12 characteristic curve 51.

The current of modulated signal 25 (FIG. 2c) passes through a range of pulsed currents 25a, 25b, 25c, etc. starting at point 49 and increasing to the threshold point of diode 12, e.g., point 27 as indicated in FIG. 3. Reference lines 27', 29', 31', and 49' represent the critical current values through which the characteristic curve 51 is traced. These reference lines identify the respective current levels at which the corresponding points 27, 29, 31, and 49 occur. During each modulating cycle, i.e., the period of each rectified wave of FIG. 2(b) as shown, diode 12 is thus triggered into the TRAPATT mode of operation at point 27 as seen in FIG. 3. During the TRAPATT mode, diode 12 exhibits a negative resistance region 52 until the current reaches a level indicated by point 29 at which point the negative region terminates. At the maximum current level 31, swept load line reverses and traces curve 51 back through the sequence starting again at point 49. To prevent circuit 10 from oscillating due to the oscillation of diode 12 during the TRAPATT mode, the characteristic impedance ($\sqrt{L/C}$) of circuit line 17 as determined by its inductance (L) and capacitance (C), must be greater than the magnitude of the negative resistance of diode 12. Such a characteristic impedance is achieved with a relatively short length of circuit line 17.

In a preferred arrangement for coupling oscilloscope 40 to diode 12, a resistor 42 of relatively low resistance, in the order 0.1 ohm, is connected between diode 12 and ground 44. Compared to the voltage drop across diode 12, the voltage drop across resistor 42 is negligible. Therefore, by connecting the negative terminal X of the X axis of oscilloscope 40 at a location 46 and by connecting the positive terminal X+ to ground, the voltage drop across diode 12 can be displayed along the X axis. Since the voltage drop across resistor 42 is substantially proportional to the current passing through diode 12, the current can be displayed along the Y axis of oscilloscope 40 by connecting the negative terminal Y− at location 48 and by connecting positive terminal Y+ to ground.

Figure 4:
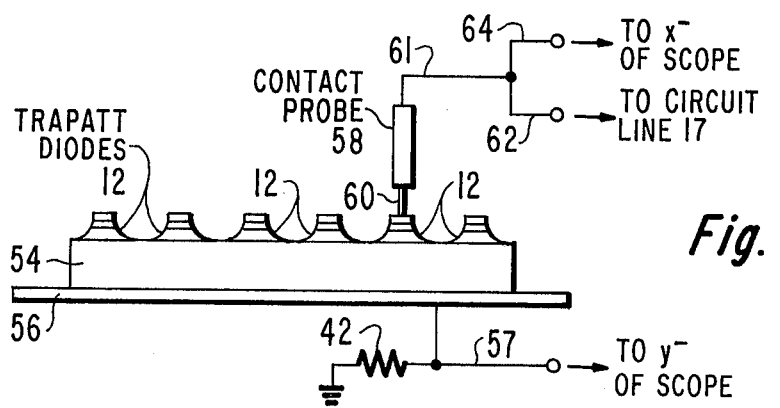
FIG. 4 is a schematic showing a group of TRAPATT diodes under test using a preferred embodiment of the invention.

Another arrangement for coupling oscilloscope 40 to diode 12 is shown in FIG. 4. A plurality of TRAPATT diodes 12 as fabricated on a single wafer 54 can be tested individually to determine their characteristics before being formed into individual diodes. Wafer 54 is placed in conductive contact with a conductive plate 56, conductive plate 56 being connected to ground as by low ohmic resistance resistor 42 as described above. The voltage drop across resistor 42 is applied across the Y− - Y+ terminals of oscilloscope 40 as by lead 57 in a manner similar to that of circuit of FIG. 1 to display, in effect, the current flowing through diode 12. The actual voltage across diode 12 is displayed by use of manual contact probe 58. Probe 58 has a contact portion 60 which makes pressure contact with one terminal of diode 12 under test. Probe 58 has a lead line 61 which splits in parallel to lines 62 and 64. Line 62 is connected to circuit line 17 of the circuit of FIG. 1 such that when contact probe 58 contacts diode 12 and establishes electrical conductivity, the modulated signal 25 drives diode 12. Line 64 is connected as described above to the negative terminal X− of oscilloscope 40 to display the voltage along the X axis.

In using oscilloscope 40 to display the current-voltage characteristic curve 51 of TRAPATT diode 12 driven by pulsed signal 16, a problem arises during the interval the pulse signal 16 is zero. For the preferable pulse duty cycle of less than 0.1 percent, the trace on oscilloscope 40 is at zero 99.9 percent of the time. This results in a very bright spot (53, FIG. 3) at the origin of the trace. Such a spot can be eliminated in accordance with a feature of another embodiment of the invention by providing a delay circuit 66 between pulse generator 14 and oscilloscope 40. Delay circuit 66 generates a blanking signal 68 which is fed into the Z− axis of oscilloscope 40, the Z+ terminal being connected to ground. Blanking signal 68 blanks the oscilloscope 40 trace during the off interval of pulse signal 16.

What is claimed is:

1. An apparatus for measuring the current-voltage characteristics of a specimen diode having a voltage response which is a single-valued function of current, comprising:

means for generating a pulsed signal at a given pulse repetition rate;

means for generating a modulating signal for modulating said pulsed signal, said modulating signal having a periodic time-varying amplitude and a periodic rate that is significantly less than the repetition rate of said pulsed signal;

means responsive to said modulating signal for modulating said pulsed signal to generate a periodic modulated pulsed signal, the amplitude of said modulated pulsed signal increasing and decreasing periodically with respect to time, the current of said periodically modulated pulsed signal being swept through a predetermined range of current values during each modulation period, said means responsive to said modulating signal for modulating comprising a switching diode connected between an output of the means for generating a modulating signal and the output of the means for generating a pulsed signal and at least one transistor connected by means of its collector and emitter electrodes between said switching diode and said specimen diode;

means for coupling said modulated pulsed signal to said specimen diode, said specimen diode producing a single-valued voltage as a function of the current of said modulated pulsed signal; and means for coupling said specimen diode to indicating means for indicating the output current-voltage characteristics of said specimen diode.

2. An apparatus according to claim 1, wherein said modulating means includes resistive means for limiting the amplitude of the current of said modulated pulsed signal.

3. An apparatus according to claim 1, wherein said transistor has an emitter, collector and base electrodes, said emitter electrode being connected to one terminal of said switching diode, said collector electrode being connected to one terminal of said specimen diode, and further including a bias resistor of relatively high ohmic resistance, said resistor being connected between ground and said base electrode, said resistor providing a positive bias of said base electrode with respect to said emitter electrode.

4. An apparatus according to claim 1, wherein said means for generating a modulating signal comprises a full wave bridge rectifier for modulating said pulsed signal by a full wave rectified sine wave signal.

5. An apparatus according to claim 1, wherein said indicating means comprises an oscilloscope coupled to said specimen diode such that the instantaneous voltage across said specimen diode is displayed on the horizontal axis of said oscilloscope and the current passing through said diode is displayed on the vertical axis of said oscilloscope.

6. An apparatus according to claim 5, further including means responsive to said pulsed signal for producing a blanking signal to said oscilloscope for blanking said oscilloscope during the off interval of said pulsed signal.

7. An apparatus according to claim 5, further including a resistor connected between ground and said specimen diode, said resistor having a relatively low ohmic resistance such that the voltage drop across said resistor is negligible compared to the voltage drop across said specimen diode, said oscilloscope being coupled to said diode and said resistor such that the vertical axis of said oscilloscope indicates the current through specimen diode in response to the voltage drop across said resistor.

8. An apparatus according to claim 1, wherein said means for coupling said indicating means to said diode comprises manual probe contact means whereby any one of a plurality of specimen diodes can be selectively measured.

9. An apparatus according to claim 1, wherein said specimen diode is a TRAPATT diode having a threshold value at and above which said TRAPATT diode operates in the TRAPATT mode, the current of said modulated pulsed signal passing through the threshold value of said TRAPATT diode, triggering thereby said TRAPATT diode into the TRAPATT mode of operation during each modulation period, said TRAPATT diode exhibiting a negative resistance during said TRAPATT mode and wherein said coupling means further includes impedance means having a characteristic impedance greater than the magnitude of said negative resistance to prevent said apparatus from oscillating during the TRAPATT mode of operation.

* * * * *